(12) United States Patent
Hackemack et al.

(10) Patent No.: US 9,081,033 B2
(45) Date of Patent: Jul. 14, 2015

(54) TEST AND CONNECTION APPARATUS ARRANGEMENT, AND CONNECTION APPARATUS

(75) Inventors: Frank Hackemack, Detmold (DE); Joerg Richts, Schlangen (DE); Bernhard Jaschke, Lage (DE)

(73) Assignee: WEIDMUELLER INTERFACE GMBH & CO. KG, Detmold (DE)

( * ) Notice: Subject to any disclaimer, the term of this patent is extended or adjusted under 35 U.S.C. 154(b) by 121 days.

(21) Appl. No.: 14/119,968

(22) PCT Filed: May 21, 2012

(86) PCT No.: PCT/EP2012/059383
§ 371 (c)(1),
(2), (4) Date: Nov. 25, 2013

(87) PCT Pub. No.: WO2012/163713
PCT Pub. Date: Dec. 6, 2012

(65) Prior Publication Data
US 2014/0077832 A1    Mar. 20, 2014

(30) Foreign Application Priority Data

Jun. 3, 2011  (DE) ............... 20 2011 101 414 U
May 21, 2012 (WO) ............... PCT/EP2012/059383

(51) Int. Cl.
*G01R 1/067* (2006.01)
*G01R 31/00* (2006.01)
(Continued)

(52) U.S. Cl.
CPC .......... *G01R 1/0416* (2013.01); *G01R 1/07307* (2013.01); *H01R 9/2666* (2013.01); *G01R 1/04* (2013.01)

(58) Field of Classification Search
CPC ...... H01R 9/2666; G01R 1/04; G01R 1/0416; G01R 1/07307

USPC .......... 324/71, 378, 403, 415, 425, 500, 537, 324/555, 750.01, 755.04, 755.05; 439/607.01, 660
See application file for complete search history.

(56) References Cited

U.S. PATENT DOCUMENTS

| 4,676,568 A * | 6/1987 | Nault et al. ............ 439/169 |
| 2008/0106266 A1 * | 5/2008 | Diessel ............ 324/415 |
| 2012/0094535 A1 * | 4/2012 | Zhang ............ 439/607.01 |

FOREIGN PATENT DOCUMENTS

| CH | 663 493 A5 | 12/1987 |
| DE | 197 09 054 C1 | 7/1998 |
| DE | 29917825 U1 | 2/2001 |
| DE | 10 2004 040 859 A1 | 3/2006 |

(Continued)

*Primary Examiner* — Jermele M Hollington
*Assistant Examiner* — Raul Rios Russo
(74) *Attorney, Agent, or Firm* — Lawrence E. Laubscher, Sr.; Lawrence E. Laubscher, Jr.; Robert D. Spendlove

(57) ABSTRACT

A testing arrangement is provided for testing the electrical circuits of an assembly of terminal blocks arranged in side-to-side relation, each of the terminal blocks including two mutually-insulated collinearly-arranged horizontal bus bar sections that are normally electrically connected by first and second pairs of leaf spring contacts arranged above and below the bus bar sections, respectively. During the testing operation, the testing device may be arranged either above or below the assembly, and an insulating test plug on the testing device is inserted either vertically downwardly from above, or upwardly from below, the terminal block, thereby to disengage one pair of contacts. A dummy plug is vertically inserted in the opposite direction to disengage the other pair of contacts. The remote ends of the bus bar sections are provided with clamping devices for connection with the bare ends of insulated conductors, respectively.

11 Claims, 8 Drawing Sheets

(51) Int. Cl.
*G01R 1/04* (2006.01)
*H01R 9/26* (2006.01)
*G01R 1/073* (2006.01)
*G01R 31/02* (2006.01)
*G01R 31/327* (2006.01)

(56) References Cited

FOREIGN PATENT DOCUMENTS

DE     10 2006 052 894 A1    5/2008
DE     102006052894 B4    5/2013

* cited by examiner

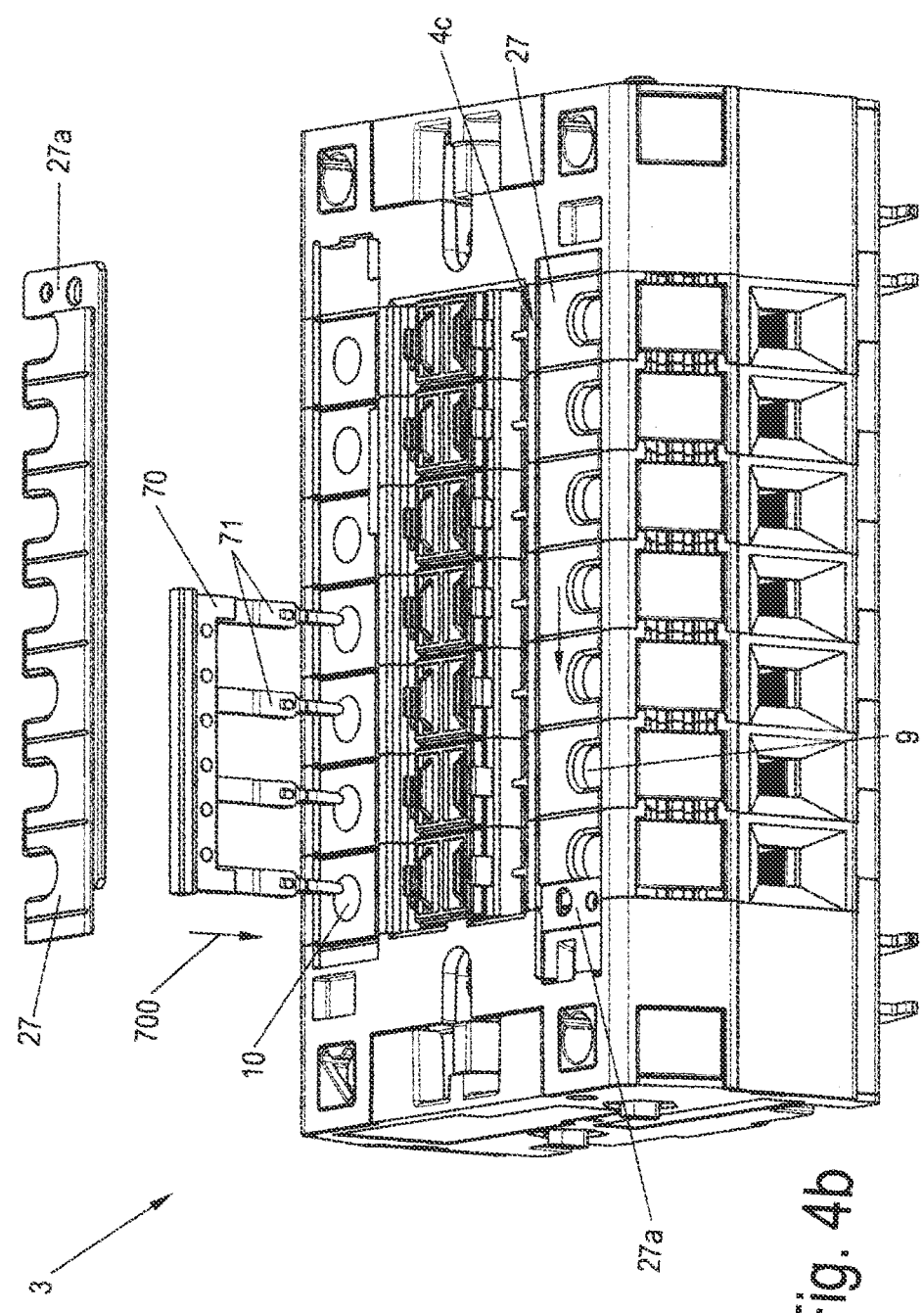

TEST AND CONNECTION APPARATUS ARRANGEMENT, AND CONNECTION APPARATUS

REFERENCE TO RELATED APPLICATIONS

This application is a national stage application under 35 U.S.C. §371 of PCT International Application No. PCT/EP2012/059383 filed May 21, 2012, which claims priority of German application No. 20 2011 101 414.6 filed Jun. 3, 2011. It is related to the companion U.S. application Ser. No. 14/087,115 filed Nov. 22, 2013, and the U.S. application Ser. No. 14/123,212 filed Nov. 30, 2013.

BACKGROUND OF THE INVENTION

1. Field of the Invention

A testing arrangement is provided for testing the electrical circuits of an assembly of terminal blocks arranged in side-to-side relation, each of the terminal blocks including two mutually-insulated collinearly-arranged horizontal bus bar sections that are normally electrically connected by first and second pairs of leaf spring contacts arranged above and below the bus bar sections, respectively. During the testing operation, the testing device may be arranged either above or below the assembly, and an insulating test plug on the testing device is inserted either vertically downwardly from above, or upwardly from below, the terminal block, thereby to disengage one pair of contacts. A dummy plug is vertically inserted in the opposite direction from the other side of the terminal block, thereby to disengage the other pair of contacts.

2. Description of Related Art

It has been proposed in the prior art to provide testing devices for testing the electrical circuits of an assembly of terminal blocks, wherein the testing device is normally arranged above the assembly. This is particularly true when the terminal block assembly is mounted on a mounting rail, for example, in a panel box. Since it is possible to mount the terminal block assembly in a wall opening, it is sometimes desired to test the electrical circuits from the lower surface of the assembly from beneath the wall and below the terminal block assembly.

An arrangement of that sort includes a terminal block assembly for the connecting a plurality of electrical conductors, and a testing device adapted for connection with terminal block assembly in order to test and measure electric variables that are associated with the electrical conductors, and thus with the electrical devices that are connected thereto. In so doing, measuring and testing procedures are carried out without a modification of the existing electrical circuit.

A continually increasing need for arrangements of that sort, for example in areas of automation, produces the demand for improved functions groups as well as for an enlarged area of use. The challenge of the present invention was therefore to provide an improved terminal block arrangement that could be tested from different locations.

SUMMARY OF THE INVENTION

Accordingly, a primary object of the present invention is to provide a testing arrangement for testing the electrical circuits of an assembly of terminal blocks arranged in side-to-side relation, including a testing device that may be connected alternatively with either the upper or the lower sides of the assembly.

According to a more specific object of the invention, each of the terminal blocks includes two mutually-insulated collinearly-arranged horizontal bus bar sections that are normally electrically connected by first and second pairs of leaf spring contacts arranged above and below the bus bar sections, respectively. During testing, the testing device may be arranged either above or below the assembly, and an insulating test plug on the testing device is inserted either vertically downwardly from above, or upwardly from below, the terminal block, thereby to disengage one pair of the electrical contacts. A dummy plug is vertically inserted in the opposite direction from the other side of the terminal block, thereby to disengage the other pair of electrical contacts. The remote ends of the bus bar sections are provided with clamping contacts for connecting the bare ends of insulated conductors with the bus bars, respectively.

The arrangement of the present invention makes the advantages possible of the measuring and testing procedures outside of the product into which the connection device is integrated with the simultaneous increase of the connection possibilities of the testing device.

With an inventive arrangement of a testing device and a terminal block assembly for the connection of electrical conductors with which the testing device can be plugged into a terminal block of the assembly, and in so doing, interrupts an electrical connection between two contact tabs that are in electrical engagement with each other, whereby the testing device can be plugged in alternatively from an upper side of the terminal block assembly or from a lower side of the assembly.

Specifically, the testing device is plugged into this either from the upper side of the terminal block assembly, or from the lower side. Within this context, it is preferable that the terminal block has a first pair of upper contact tabs that are in electrical engagement on the upper side of the assembly, and a second pair of lower contacts that are in electrical engagement on the lower side of the assembly. Within this context, the two contact tabs that are arranged on the upper side and the two contact tabs that are arranged on the lower side are preferably arranged opposite each other above an below a pair of electrically isolated bus bar sections. Specifically, with reference to the contact tabs, the connection device is preferably arranged as symmetric. This makes it possible to plug in the testing device both from the upper side of the connection device and from its lower side without an additional or elaborate constructive adaptation of the connection device needing to be carried out.

The two contact tabs that are arranged on the upper side, and the two contact tabs that are arranged on the lower side, are preferably leaf spring contacts that are electrically connected in parallel. In the electrical respect, as well, no constructive adaptations of the connection device are therefore necessary for the plugging in and connecting of the testing device correspondingly from either the upper side or the lower side. In addition, this is possible in a simple way within the connection device, by means of which it is not enlarged in its volume.

In order to avoid a faulty connecting of the testing device, in particular a bridging of the testing device, an electrically isolating dummy plug element is provided. It is preferred that with the testing device that is plugged into the connection device from the upper side of it, the dummy plug element electrically interrupts the contact tabs that are electrically contacting with each other that are arranged on the lower side of the connection device, while with the testing device that is plugged into the connection device from the lower side of it, the plug element electrically interrupts the contact tabs that are electrically contacting with each other that are arranged on the upper side of the connection device. This dummy plug element, which can once again be removed, makes it possible to adapt the connection device according to the position of the testing device to the upper side or to the lower side of the connection device unplugging it and re-plugging it into a different socket without requiring additional constructive adaptations.

It is especially preferred for the dummy plug element to be arranged in the connection device as not detachable. In principle, though, an embodiment is also conceivable with which the plug element is detachably plugged into the connection device. In this latter arrangement, though, it is preferred that with the terminal block assembly, it is detachable from the connection device with difficult accessibility or else only with a significant expenditure of effort. For this purpose, the plug element preferably has a locking means with which it can be locked in the connection device. The terminal block preferably has a locking means counterpart which, in an especially preferred embodiment, is the housing. Upon the plugging in, the locking means locks with the locking means counterpart such that it is locked in the connection device either non-detachably or else detachably only with difficulty, for example, by means of the partial disassembly of the connection device or at least with an additional tool.

According to another feature, the terminal block assembly has at least one protective cover element that is slidably longitudinally displaceable between a covering position covering access openings contained in the terminal block, and uncovered positions that provide access to the access openings. Thus a simpler and quicker protection against manipulation is made possible. The at least one protective element is movably housed in a guide of a housing of the connection device in the longitudinal direction of the connection device. Such an arrangement is simple and within that context, the protective element can be easily and quickly adjusted.

Within this context, it is provided that the at least one protective element correspondingly has one covering area with one covering opening per clamping unit. In this way, a protective element can be adapted for a certain number of clamping units by means of a simple cutting to length.

According to another feature, the terminal block assembly is provided for mounting on a mounting rail and/or mounting on a wall. As a result of this, a varied area of use is created. The arrangement of a testing device and a connection device has at least two pairs of support feet that can be fastened, each of which has mounting rail holding sections for the mounting of the connection device on a mounting rail, and wall holding sections for the mounting of the connection device on a wall.

The support feet that can be fastened may be plugged in and locked, for example, into the lower side of the housing of the connection device in retainers or recesses that have been provided for this, in order to secure the connection device both to a mounting rail and to a wall element. As a result of this, a varied possibility for mounting is provided with the same supports.

To permit connection of the testing device for the plugging in on both sides of a testing device (i.e., from the upper side of the assembly and from the lower side), the arrangement is provided with first and second pressure springs.

BRIEF DESCRIPTION OF THE DRAWINGS

Other objects and advantages of the invention will become apparent from a study of the following specification, when viewed in the light of the accompanying drawing, in which:

FIG. 4b is a partially exploded perspective view of the terminal block assembly;

DETAILED DESCRIPTION OF THE INVENTION

Figure 1:
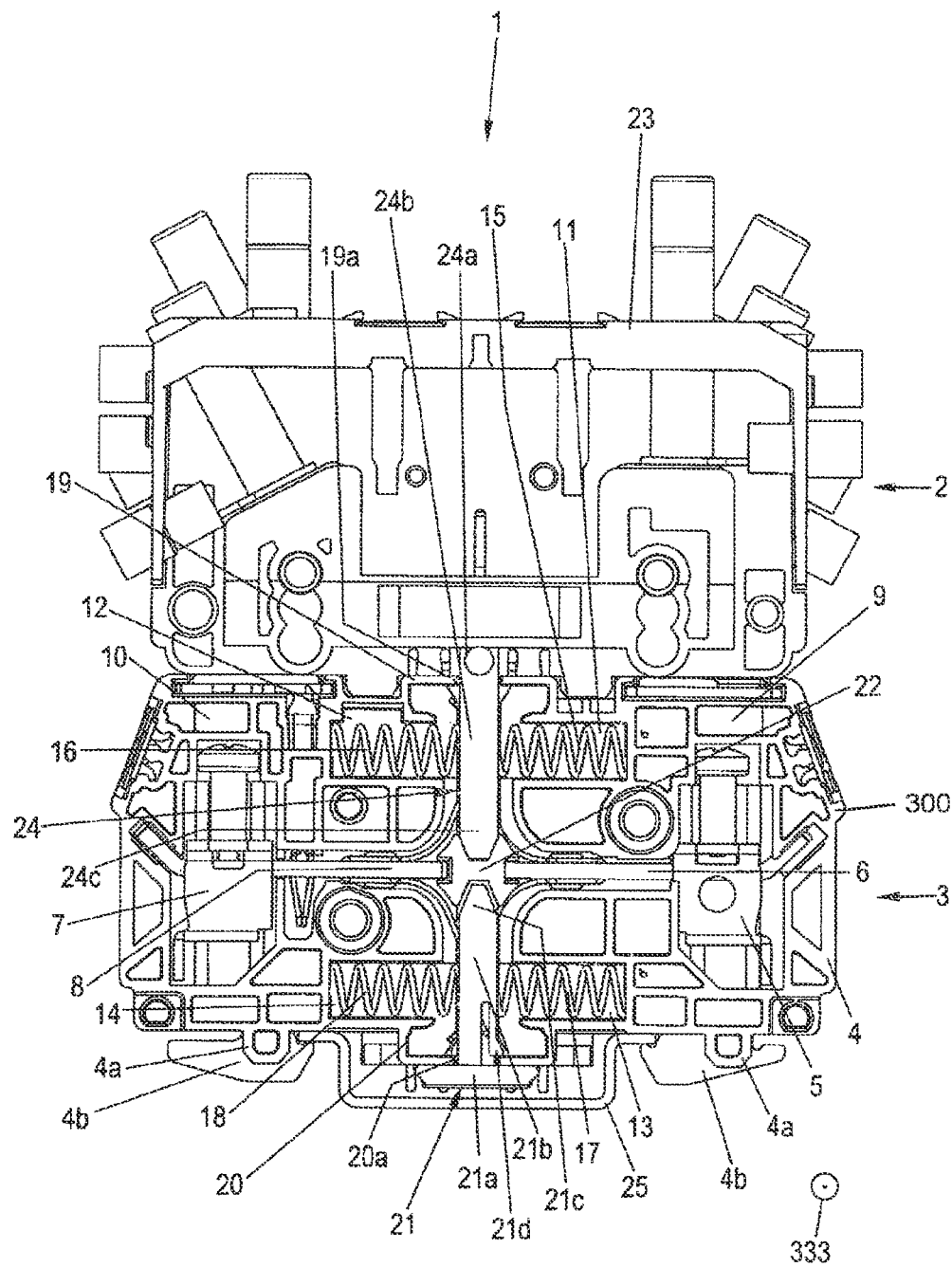
FIG. 1 is a partly sectioned side elevation view of testing arrangement with the terminal block assembly mounted on a mounting rail, and with the testing device mounted above the terminal block assembly.
Figure 2:
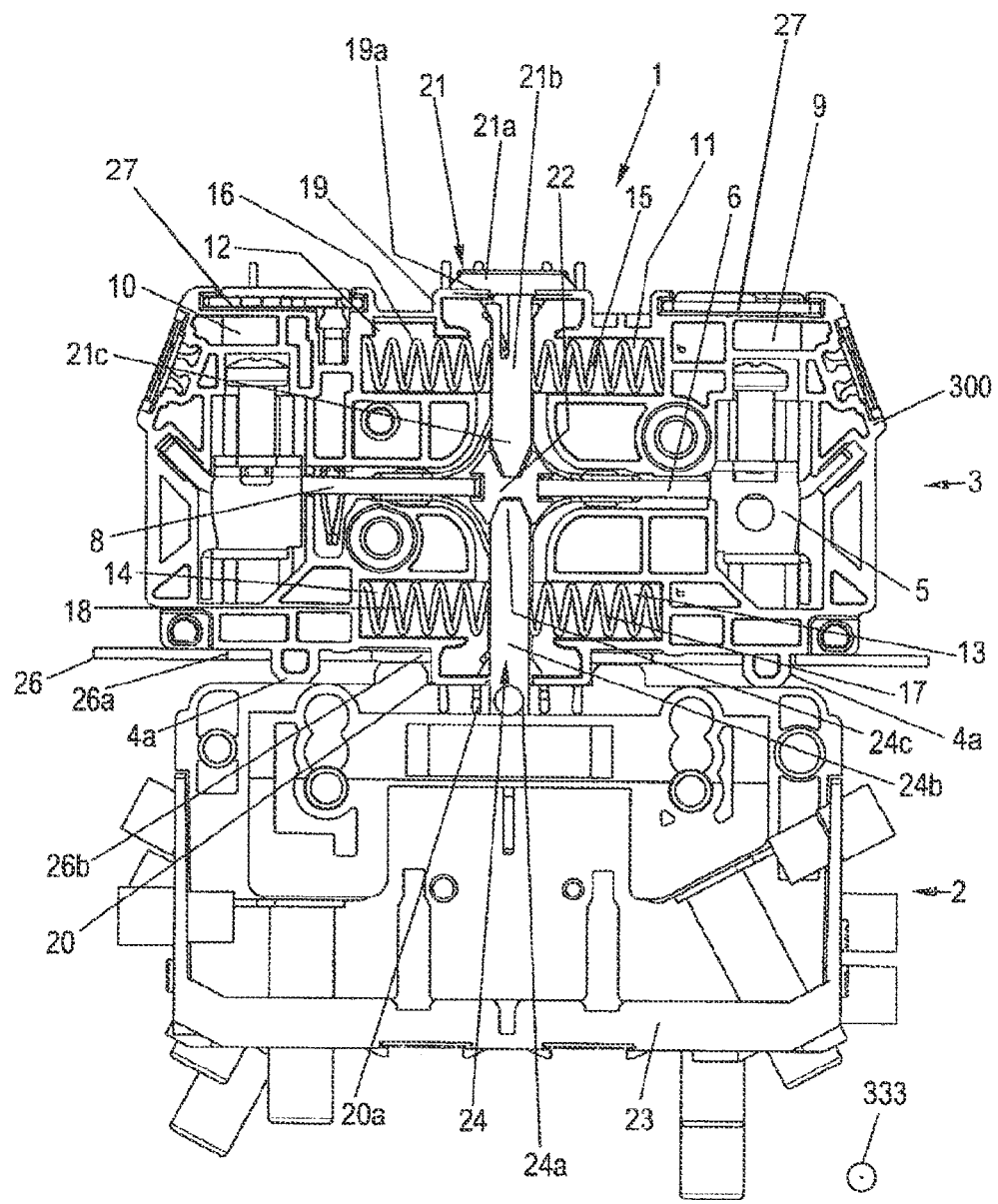
FIG. 2 is a partly sectioned side elevation view with the terminal block assembly mounted above an opening contained in a fixed support wall, and with the testing device mounted below the terminal block assembly and below the support wall, a dummy plug being inserted via an opening contained in the top wall of the terminal block.

As a broad overview, referring first to FIG. 1, the terminal block testing arrangement 1 includes a testing device 2 for testing a terminal block assembly 3 that is mounted on a mounting rail 25. The terminal block assembly includes a plurality of terminal blocks 300 arranged in stacked side-by-side relation, which components are connected by connecting means 4 (FIG. 4a) to define the assembly 3, as will be described below (and in the companion U.S. application Ser. No. 14/087,115). Each terminal block 300 has a rectangular body formed of thermoplastic synthetic plastic insulating material, as is known in the art. The terminal block body includes chambers that contain a pair of horizontal coplanar conductive bus bar members 6 and 8 that are separated at their adjacent ends by an electrically insulating spacer member 22. At their remote ends, the bus bars are connected with screw-operated conductor clamping devices 5 and 7, respectively, that connect with the bus bars the bare ends of conductors (not shown) that extend normal to the terminal block side walls. Access chambers 9 and 10 are provided in the upper wall of the terminal block above the clamping devices 5 and 7, respectively, which chambers are closed by the protective slide members 27 (FIGS. 2, 4a and 4b).

Respectively connected with the upper surfaces of the bus bars 5 and 7 are upper leaf spring contacts 15b and 16b (FIG. 3) having upper tip portions 15a and 16a that are biased toward electrical engagement by compression springs 15 and 16 mounted in the terminal block. Similarly, there are connected with the lower surfaces of the bus bars the lower leaf spring contacts 17b and 18b which are biased toward electrical engagement by the compression springs 17 and 18, respectively. In FIG. 1a, the tips of these lower leaf spring contacts are separated by the dummy insulating pins 21 having locking tabs 21a, and the tips of the upper leaf spring contacts are separated by the insulated test plug 24 of the testing device 2 inserted through opening 19a contained in the terminal block top wall, whereby the bus bars 6 and 8 are in a disconnected testing condition. Basically, this arrangement corresponds with a pair of on-off switches connected in parallel across conductor clamping contacts 5 and 7.

The testing device 2 serves for testing and measuring electrical quantities of electrical appliances hooked up to the terminal block assembly, which shall not be described in further detail. The testing device 2 has a housing 23, and is described in greater detail in the companion application Ser. No. 14/087,115. In the housing are arranged not otherwise specified plug and switch devices for testing and/or measuring purposes. On the bottom side of the testing device 2 are arranged pin elements 24, of which only one is shown here as an example for all the others. With these pin elements 24 and optionally other switches, which will not be discussed further, the testing device 2 is inserted into the connection device 3. As will be described in greater detail below, the bottom portion of the terminal block connecting means 4 is provided at opposite ends with pairs of mounting feet 4a (FIG. 6) that serve to mount the assembly on the inverted hat-shaped mounting rail 25 (FIG. 1).

Figure 4A:
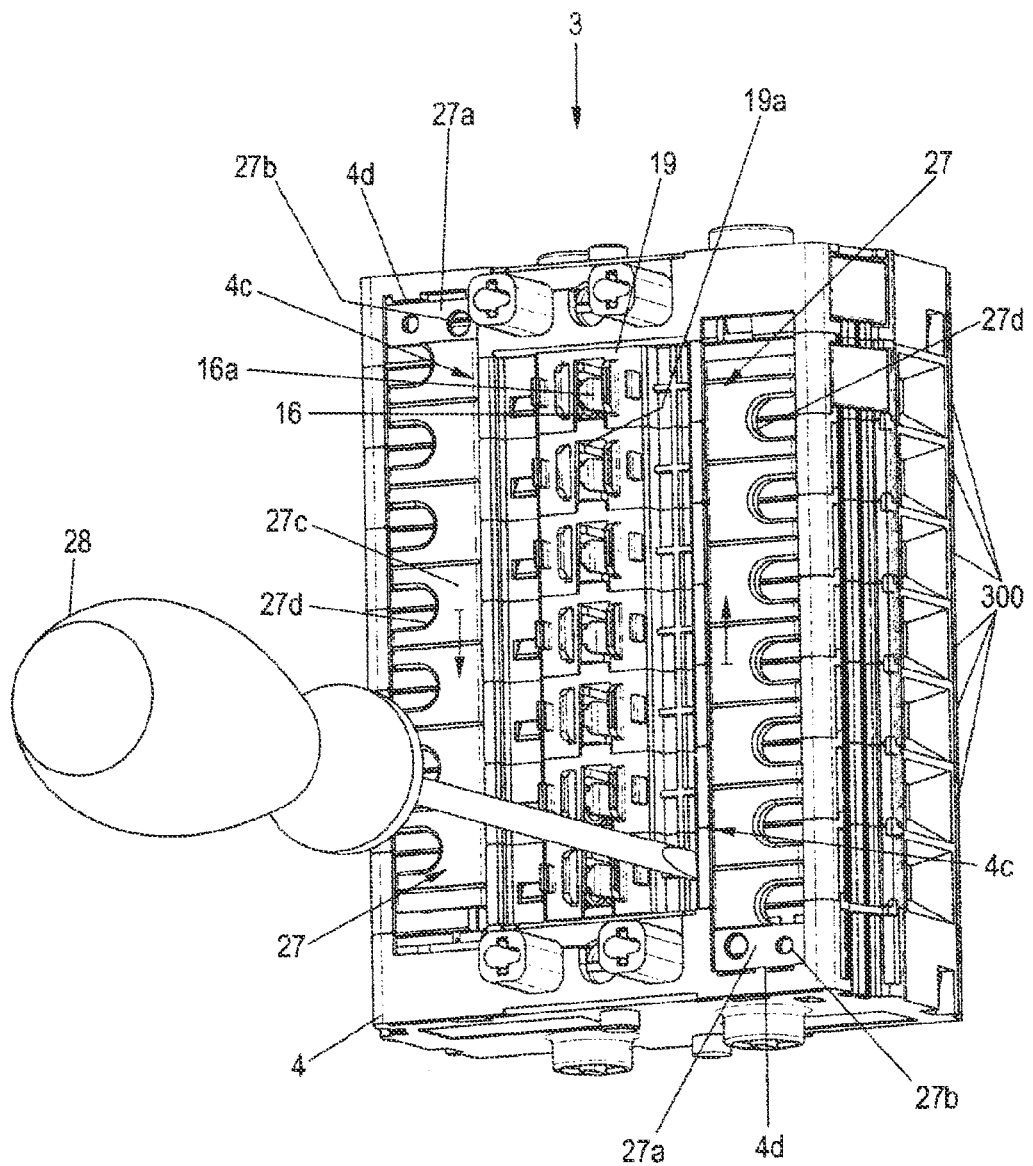
FIG. 4a is a top perspective view of the terminal block assembly, together with an operating tool for adjusting a protective cover between the closed and open positions.

As shown in FIG. 4a, the terminal block assembly 3 includes a stack of seven terminal blocks 300 that are connected together in contiguous side-by-side relation by connecting means 4. As is described in the companion U.S. application Ser. No. 14/087,115, these connecting means include a pair of end units that are connected together by longitudinal locking rods that extend through openings contained in the terminal block stack. The terminal blocks 300 are designed for connection with electrical conductors (not shown), which can be introduced essentially at right angles to the longitudinal axis of the assembly 3 (which is normal to the plane of the drawing in FIGS. 1 and 2) from either side into the connector units 300 and fastened in clamping units 5 and 7. The clamping units 5 and 7 in this sample arrangement are shown as one pair, but of course even larger numbers of pairs are possible.

Referring now to FIG. 2, the terminal block assembly 3 of FIG. 1 is arranged above an opening 26a contained in horizontal wall 26, and the testing device is inverted and arranged below the wall opening, with the test plug 24 extending upwardly through an opening 20a contained in the terminal block lower wall to effect separation of the leaf spring contacts 17a and 18a. A dummy plug 21 is inserted downwardly through the upper wall opening 19a to effect separation of the upper pair of leaf spring contacts 15b and 16b. The terminal block support feet 4a and the lower central portion of the terminal block extend into the wall opening 26a. Thus, the connection device 3 can be assembled with the testing device 2 from either side.

Figure 3:
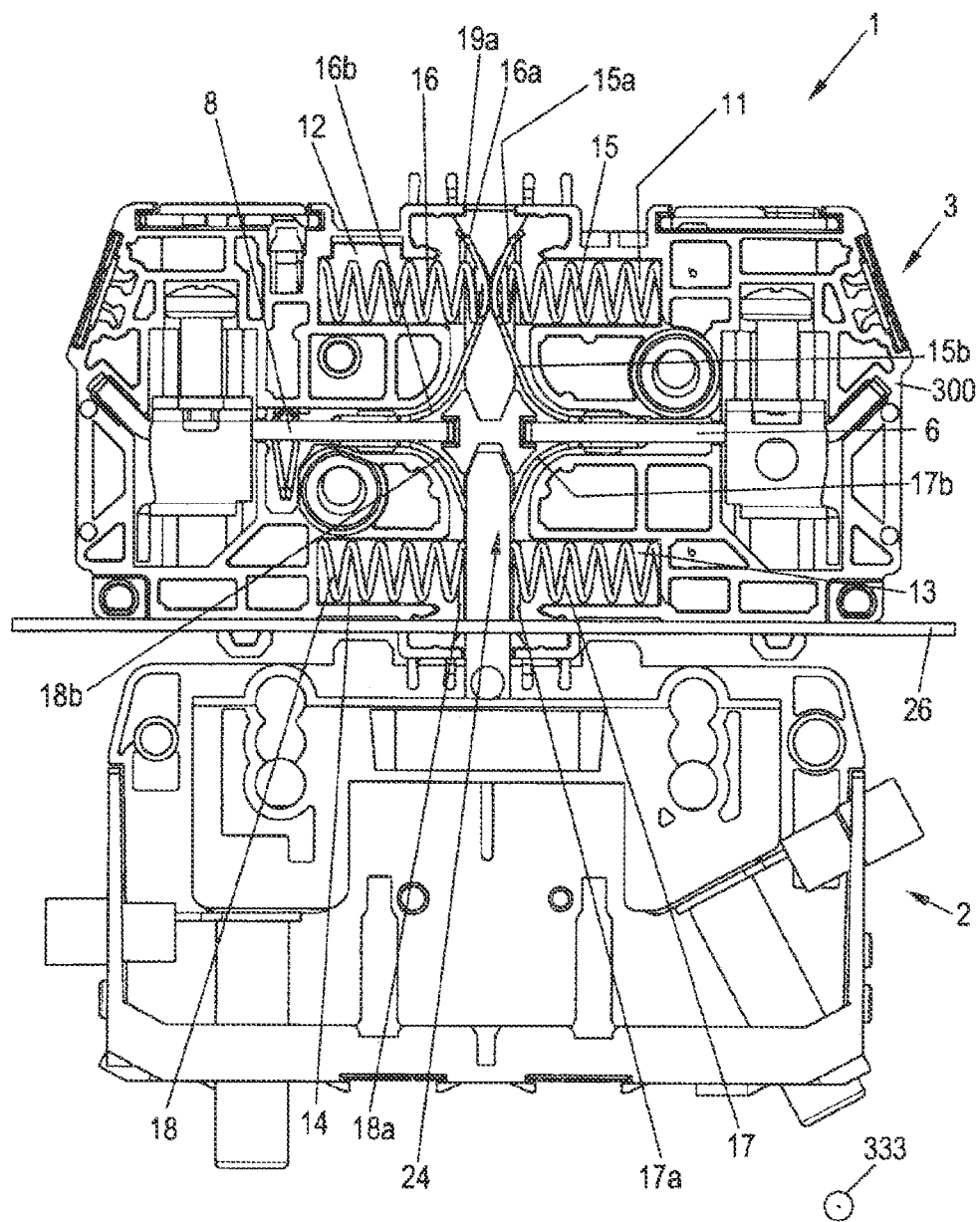
FIG. 3 is a partly sectioned side elevation view corresponding to FIG. 2 with the dummy plug removed.

FIG. 3 illustrates the first and second pairs of contact tabs 15a, 16a and 17a, 18a connected with the upper and lower surfaces of the bus bar sections, respectively. The first and second contact tabs 15a, 16a and 17a, 18a face each other as pairs between the first compression springs 15 and 16, and the second compression springs 17, 18. The second contact tabs 15a and 16a make contact, since as of yet no plug element 21 has been inserted. The first and second contact tabs 15a, 16a and 17a, 18a have spring segments 15b, 16b, 17b, 18b, by which they are secured in electrically conducting manner on the bus bars 6 and 8. Therefore, in mirror image to the bus bars 6, 8, the facing contact tabs 15a, 17a and 16a, 18a are joined together in electrically contacting manner by the bus bars 6, 8. In other words, the contact tabs 15a and 17a are connected to the bus bar 6, and the contact tabs 16a and 18a too the bus bar 8. In FIG. 3 the upper first contact tabs 15a and 16a are represented without plug element 21, while the lower second contact tabs 17a and 18a are forced apart by the pin element 24.

As shown in FIGS. 4a and 4b, the terminal block assembly includes two sliding protective members 27 mounted in guides 4c for sliding movement by tool 28 between a first dust-protecting covering position (FIG. 4a) above the access openings 9 and 10, and an uncovered open position (FIG. 4b). In the open position of FIG. 4b, openings 27d in the protective members are arranged above the access openings in the terminal blocks. As shown in FIG. 4b, conductive bridge members 70 having downwardly extending leg portions 71 may be inserted into the access openings for engagement with the corresponding clamping devices, thereby to connect together selected ones of the terminal blocks.

Figure 5:
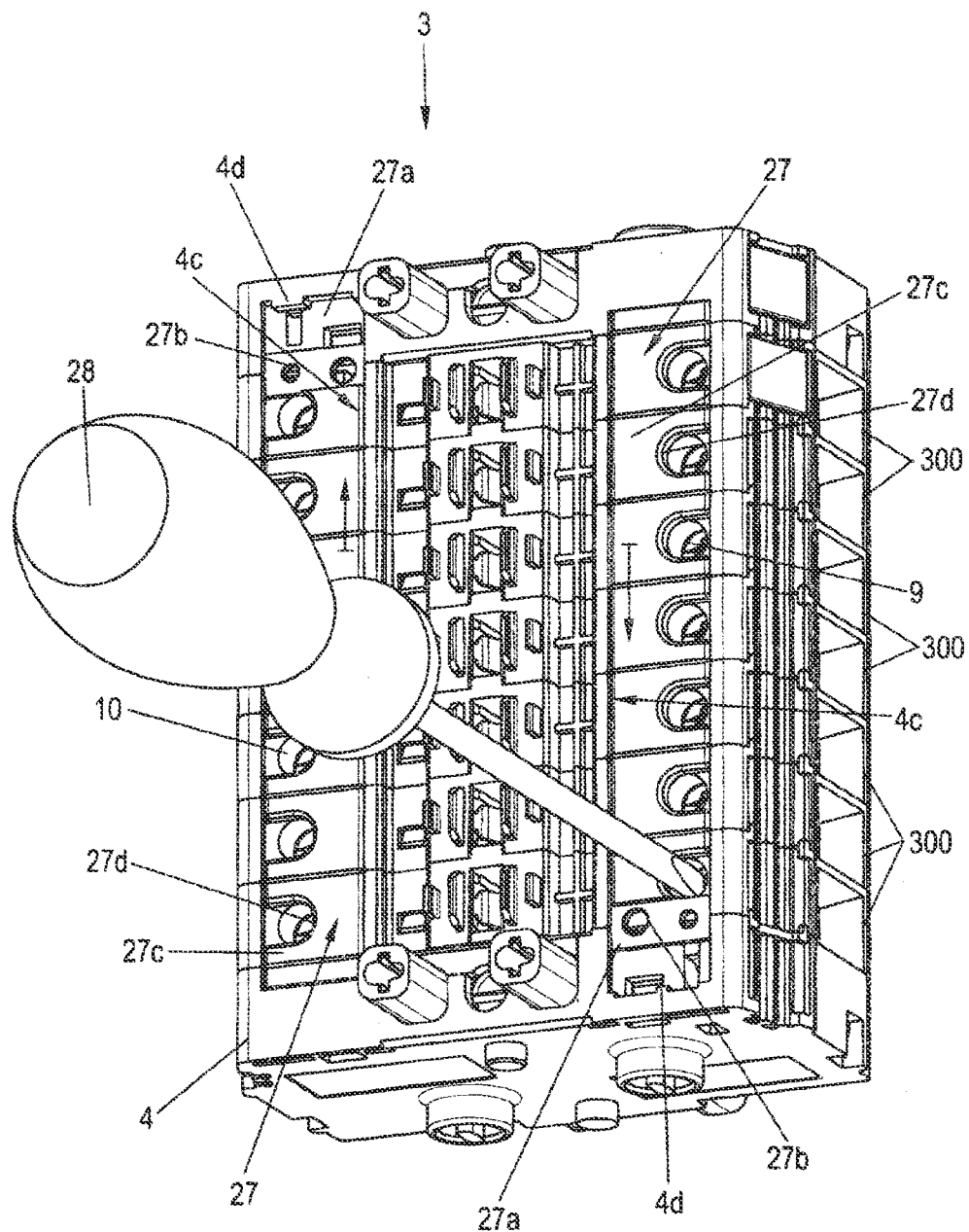
FIG. 5 is a top perspective view of the terminal block assembly, together with an operating tool for adjusting the protective covers when in the open position.

In FIG. 5, it will be seen that the protection elements 27 have been shifted so that the cover openings 27d of the cover fields 27c are arranged above the activating segments 9 and 10 of the clamping units 5, 7 and an access to the clamping units 5, 7 is possible, for example, with the tool 28 (i.e., a screwdriver). The activating parts 27a of the protection elements 27 are arranged here at a distance from the end stops 4d of the housing 4.

Figure 6:
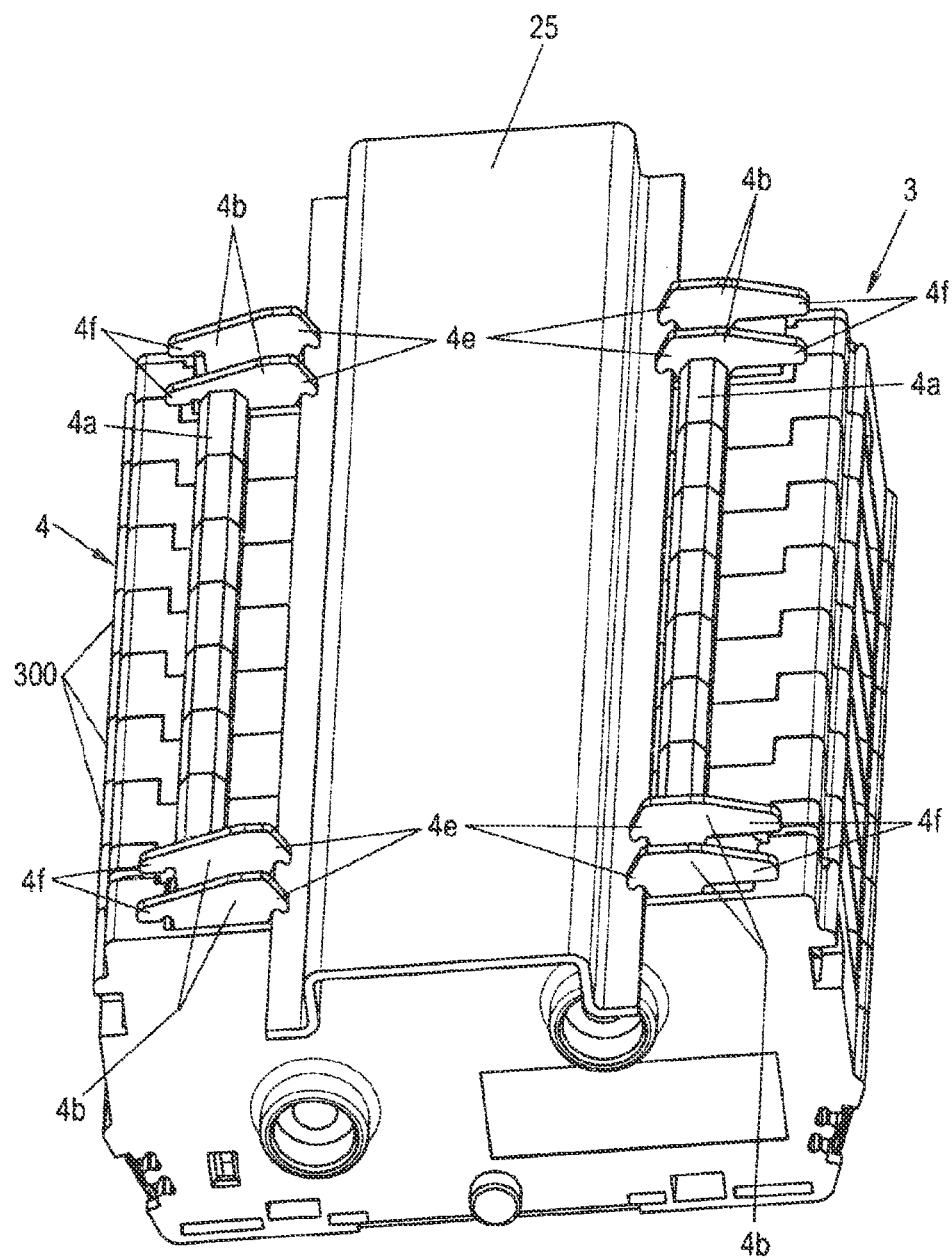
FIG. 6 is a bottom perspective view of the terminal block assembly when mounted on a mounting rail.

In the bottom perspective view of FIG. 6, it will be seen that the terminal block assembly 3 is mounted on the mounting rail 25 by two pairs of mounting feet that extend downwardly at each end of the assembly. Each support foot 4b has one end pointing inward toward the mounting rail 25 with a mounting rail support section 4e in the form of a lug. At the other ends, each of which points outward, the support feet s 4b are configured with arm-like bracket sections 4f. These support feet are arranged at the lower edge portions of the end support members 400 (FIG. 8a). During the mounting of the assembly 3 on the mounting rail 25 as shown in FIG. 6, the assembly 3 is held on the mounting rail 25 by means of the mounting rail support sections 4e of the support feet, as the mounting rail support sections 4e reach around a segment of the mounting rail 25. For this, the holders 4b can be inserted or locked in corresponding recesses of the housing 4 in the position shown after the connection device 3 has been placed in them, or they can be shoved toward each other in the direction of the mounting rail 25 to create the reaching across the mounting rail support section 4e. But the connection device 3 can also be shoved onto the mounting rail 25 in its longitudinal direction. Other options are conceivable, of course.

Figure 7:
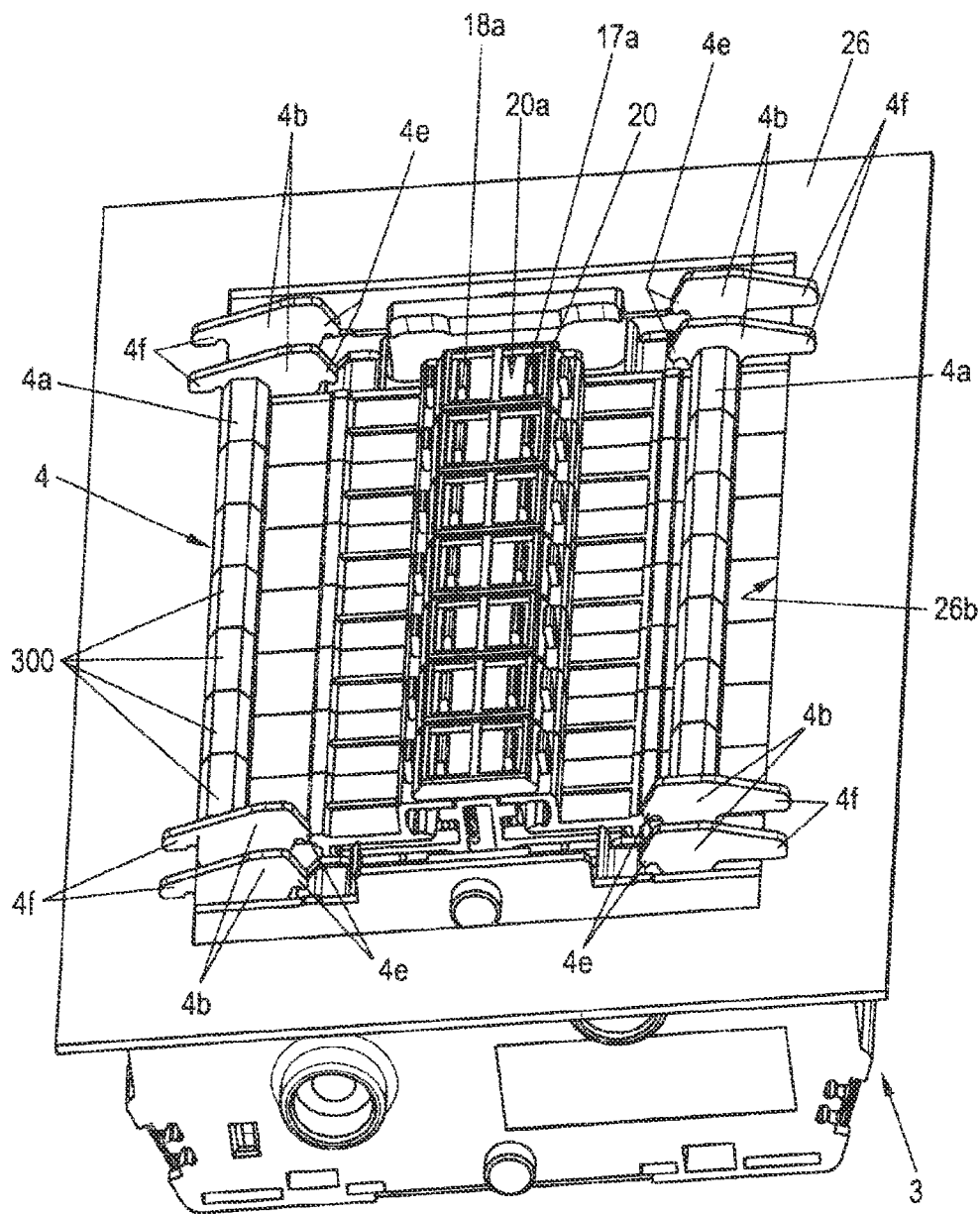
FIG. 7 is a bottom perspective view of the terminal block assembly when mounted in a wall opening.

In FIG. 7, the terminal block assembly 3 is supported by the lug portions 4f of the mounting feet 4b in the wall opening 26b. In this arrangement, the mounting feet 4b and the center portion 307a of the assembly extend below the plane of the horizontal wall 26.

More particularly, the testing device 2 is provided for plugging into the connection device 3 and serves for the testing and measuring of electrical values of electrical devices that are connected to the connection device 3 which will not be described in greater detail. The testing device 2 has a testing device housing 23 and is not depicted in greater detail. Plugging and switching devices for testing purposes and/or measuring purposes, which are not described in further detail, are arranged in the housing. Pin elements 24 are attached to the lower side of the testing device 2, of which only one is depicted here which is an example also representing all others. With these pin elements 24 and, should the need arise, with other plugs which will not be gone into in further detail, the testing device 2 is plugged into the connection device 3.

As shown in FIGS. 4 and 5, the terminal block assembly 3 has seven terminal blocks 300 that are arranged adjacent each other, of which one is depicted in section also representing the others in FIGS. 1 and 2 with its assembly housing 4. The terminal blocks s 300 correspondingly serve for the connecting electrical conductors which can essentially be plugged into the connection units 300 at a right angle to the longitudinal axis of the connection device 3 (which in FIGS. 1 and 2 is normal to the plane of the drawing) on both sides and fastened to the clamping units 5 and 7. The clamping units 5 and 7 are illustrated as one pair, and it is apparent that larger numbers of pairs are also possible. The clamping units 5 and 7 are provided here with screws which can be reached through a corresponding access openings 9, 10 from the upper side of the connection device 3. The clamping unit 5 is connected with a bus conductor 6, while the opposite clamping unit 7 is connected in a mirror image with a bus conductor 8. The bus conductor sections 6 and 8 lie in a plane and are included electrically isolated from each other by an insulation element 22.

In the terminal block portion above the bus bar section 6, a first chamber 11 is arranged for the accommodating of a first pressure spring 15. On the left side at the same height, another first chamber 12 is formed for the accommodating of another first pressure spring 16. Each first pressure spring 15, 16 works together with first contact tabs 15a, 16a (see FIG. 3) which are arranged between the first pressure springs 15, 16. In FIG. 1, between the first contact tabs 15a, 16a (which are not to be seen here, see FIG. 3) and the pressure springs is located the plug-in pin element 24 of the testing device 2, which shall still be described in greater detail below. Without the pin element 24 being plugged in (i.e., without the testing device 2 being plugged in) the two first pressure springs 15 and 16 press the first contact tabs 15a, 16a against each other (FIG. 3) and create between them an electrically conductive contact which, with the testing device 2 being plugged in (as is depicted in FIG. 1), is interrupted by the pin element 24.

The pin element 24 is attached to the lower side of the testing device housing 23 or is formulated with it as a single piece. This depicted element also stands for others as representing them. A pin body 24b is connected with the connection 24a with a pin point 24c. The pin element 24 of the testing device 2 is plugged through a first opening 19a of a first opening section 19 of the housing 4 of the connection device 3 between the first pressure springs 15 and 16. The first opening section 19 is located on the upper side of the housing 4 of the connection device 3. With the plugging in, the pin point 24c serves for the insertion and pressing together of the first contact tabs 15a and 16a of the first pressure springs 15 and 16 and is accommodated in the plugged-in state in the isolation element 22 which has a retainer for this that corresponds with the pin point 24c. In the plugged-in state, the first contact tabs 15a and 16a, which are pressed by the first pressure springs 15 and 16 with their contact sections that are interrupted by the pin element 24, rest on the pin body 24b which in a preferred embodiment is formulated as electrically isolating. With the plugging in of the pin body 24b between the contact tabs 15a, 15b, the pin body 24b therefore interrupts the electrical connection between the contact tabs 15a, 16a. Especially preferred are electrically conductive contact plates (not depicted) that are arranged on the pin body 24b but correspondingly on the side facing the contact tabs 15a, 16a which correspondingly tap the voltage that is on the contact tabs 15a, 16a such that an electrical circuit that flows through the contact tabs 15a, 16a is in fact interrupted. The contact plates can, however, be connected with various measuring meters in the testing device 2 or through it, such that, what can be measured is, for example, the voltage that is on the contact tabs 15a, 16a, the current that flows through the contact tabs 15a, 16a, a frequency, a power, a resistance, or a similar value.

The first pressure springs 15 and 16 are inserted into the first chambers 11 and 12 with pre-tensioning, such that a certain contact pressure of the first contact tabs 15a and 16a is present with their contacting. In the same way, a second chamber 13 with a second pressure spring 17 is arranged under the bus conductor 6 in the housing 4. On the left side at the same height, another second chamber 14 is formed for the accommodating of another second pressure spring 18. As with the first pressure springs 15 and 16, second contact tabs 17a and 18a are assigned to the second pressure springs 17 and 18 (see FIGS. 3 and 7). The second pressure springs 17 and 18 are electrically connected in parallel with the first pressure springs 15, 16. Thus with a testing device 2 that is plugged in, an electrical contact is interrupted between the second contact tabs 17a and 18a and the second pressure springs 17, 18 if a plug element 21 is inserted between the contact sections of the second contact tabs 17a and 18a of the second pressure springs 17, 18.

The second pressure springs 17 and 18 are also inserted into the second chambers 13 and 14 under pre-tensioning in order to generate a certain contact pressure with the contacting of the second contact tabs 17a and 18a. The plug element 21 is formulated similar to a nail, having a head 21a and a shaft 21b that is connected to it, along with a point 21c. It is depicted singly but also representing others and is plugged in through a second opening 20a of a second opening section of the housing 4 to its lower side between the second pressure springs 17 and 18. With the plugging in, the point 21c serves for the insertion and pressing together of the second contact tabs 17a and 18a of the second pressure springs 17 and 18 and is accommodated in the plugged-in state in the isolation element 22 which, analogously to the pin point 24c of the pin element 24, has a retainer for this that corresponds with the point 21c. In the plugged-in state, the second pressure springs 17 and 18 with their contact sections that are interrupted by the plug element 21 rest on the shaft 21b, which is formulated as electrically isolating.

In order to lock the plug element 21 in the connection device 3 in a non-detachable manner or in a manner that is detachable only with an expenditure of effort, it has a locking means 21d which locks with a locking means counterpart which in this case is the housing 4 of the connection device 3. The locking element is formulated here as a snapping stud which is formed as a single piece on the plug element 21. In addition, with the mounted connection device 3, the plug element 21 is covered by the mounting rail and therefore is arranged as inaccessible.

By means of the first and second chambers 11, 12 and 13, 14, the connection device 3 is adapted not only for the use of the mounting on a mounting rail, but also for other types of mountings, as is depicted in FIG. 2 in a schematic section view of a second embodiment of the inventive arrangement 1. Within this context, the connection device 3 is attached with its lower side on one side to a wall element 26 with wall openings 26a and wall sections 26b. The supports 4a of the housing 4 go through the wall openings 26a, while the second opening section 20 of the housing 4 protrudes on its lower side through the wall section 26b.

The testing device 2 is arranged on the other side of the wall element 26, while its pin element 24 is plugged in through the second opening 20a of the second opening section 20 between the second contact tabs 17a and 18a of the second pressure springs 17 and 18 of the second chambers 13 and 14. The testing device 2 is consequently plugged into this on the lower side of the connection device 3. Thus the supports 4a of the connection device 3 rest on the lower side of the testing device 2, such that the testing device 2 and the connection device 3 are distanced from each other in a defined manner.

In this second arrangement, the plug element 21 is plugged in from the upper side of the connection device 3 through the first opening section 19 between the first contact tabs 15a and 16a of the first pressure springs 15 and 16 in order to interrupt it. The additional functional elements and functional groups have already been described within the context of FIG. 1. Consequently, the connection device 3 can be plugged together with the testing device 2 on both sides.

If the connection device 3 is intended for mounting with a mounting rail, then it is equipped with the plug elements 21 from the lower side. With, for example, a wall mounting with which the connection device 3 is in the best case accessible from the lower side, the plug elements 21 are used from the upper side of the connection device 3.

FIG. 3 shows the second embodiment according to FIG. 2 with first and second contact tabs 15a, 16a, 17a, 18a. The first and second contact tabs 15a, 16a and 17a, 18a are correspondingly opposite to each other as pairs between the first pressure springs 15 and 16 and the second pressure springs 17, 18. The second contact tabs 15a and 16a contact each other since no plug element 21 had been plugged in yet. The first and second contact tabs 15a, 16a and 17a, 18a have spring sections 15b, 16b, 17b, 18b with which they are each attached in an electrically conductive manner to the bus conductors 6 and 8. Therefore, the contact tabs 15a, 17a and 16a, 18a that lie opposite to each other in a mirror image to the bus conductors 6, 8 are connected with each other in an electrically contacting manner by means of the bus conductors 6, 8. In other words, the contact tabs 15a and 17a are connected with the bus conductor 6, and the contact tabs 16a and 18a are connected to the bus conductor 8.

In FIG. 3, the upper, first contact tabs 15a and 16a are depicted without the plug element 21, while the lower, second contact tabs 17a and 18a are pressed against each other by the pin element 24.

FIG. 4 shows the assembly 3 with a displaceable protector 27 in a first position, and FIG. 5 depicts this protector in a second position. As has already been described above, the assembly 3 in this embodiment has seven terminal blocks 300 arranged next to each other. In FIGS. 4 and 5, the first opening sections 19 are to be recognized with the first openings 19a. In this embodiment, the first pressure springs 15, 16 are arranged as acting in combination with the contact tabs 15a, 16a, of which only the contact tabs 16a that work in combination with the first pressure springs 16 are to be seen.

In the housing 4 of the connection device 3, oblong protective elements 27 are arranged on both long sides over the clamping units 5, 7 (which are not visible) which are held in such a way that they can be moved longitudinally in the guides 4c of the housing 4 in the longitudinal direction of the connection device 3. The protective elements 27 are arranged as working in the opposite direction. The protective elements 27 are found in the first, closed position, that is, the actuating sections 9 and 10 of the clamping units 5, 7 are located underneath the protective elements 27 and are not accessible.

In the closed position, the actuating parts 27a of the protective element 27 lie with one edge on a catch 4d of the housing 4. The protective element 27 has one covering area 27c per clamping unit 5, 7 with a covering opening 27d. In order for it to be possible for the actuating sections 9 and 10 of the clamping units to be made accessible, the protective elements 27 can be moved in the directions of the arrows working in the opposite direction by means of a tool 28 via their actuating parts 27a into the second position. The clamping units 5, 7 are formulated here as clamping yoke connections (see FIG. 1). However, the invention is not restricted to this formulation. Rather, the clamping units 5, 7 may also be executed with a different connection technology, for example as tension spring connections.

The terminal block assembly 3 optionally offers the possibility of electrically connecting a plurality of clamping units 5, 7 to each other by means of cross-connectors 70. As is depicted in FIG. 4(b), during the mounting process the cross-connectors 70 are plugged in underneath the protective element 27 into the actuating sections 9, 10 in a plugging-in direction 700 such that one plug contact 71 of the cross-connector 70 correspondingly meshes with an actuating section 9, 10 and the cross-connector 70 electrically connects the actuating sections 9, 10 with each other into which the plug contacts 71 are plugged in. After the cross connector 70 is plugged in, the protective element 27 is inserted into the guides 4c such that the cross connector 70 is inaccessible in the condition as delivered of the connection device 3.

In the second position shown in FIG. 5, the protective element 27 is moved in such a way that the covering openings 27d of the covering areas 27c are arranged over the actuating sections 9 and 10 of the clamping units 5, 7 and access is possible to the clamping units 5, 7, for example with the tool (screwdriver). Within that context, the actuating parts 27a of the protective element 27 are arranged at a distance from the catches 4d of the housing 4.

FIG. 6 illustrates a schematic perspective view of an embodiment of the inventive connection device 3 with the mounting on a mounting rail from below. In this embodiment, double supports 4b are each plugged in or locked in to the housing 4 in the four corner areas on the lower side of the housing 4 of the connection device 3. Each support 4b has an end toward the inside toward the mounting rail with a mounting rail holding section 4e in the form of a catch. On the other ends, each of which points toward the outside, are arranged the supports 4b with arm-shaped wall holding sections 4f.

With the assembly of the connection device 3 on the mounting rail 25 that is depicted in FIG. 6, the connection device 3 is supported by means of the mounting rail holding section 4e of the support 4b on the mounting rail 25 by the mounting rail holding section 4e overlapping a section of the mounting rail 25. Added to this, after the connection device 3 has been applied, the supports 4b can, for example, be plugged into or locked into it in the corresponding recesses of the housing 4 in the position that is depicted or can be moved onto each other in the direction of the mounting rail 25 in order to create the overlap of the mounting rail holding section. The connection device 3 can, however, also be moved in the longitudinal direction of the mounting rail 25 onto it. Other possibilities are of course conceivable. The supports 4b have another support function by means of the wall holding sections 4f, which is depicted in FIG. 7.

FIG. 7 depicts a schematic perspective view of an embodiment of the inventive connection device 3 with the mounting on a wall from below. In this embodiment, the connection device 3 is inserted with its lower side into a wall section 26b of the wall element 26 (also see FIG. 2). The wall holding sections 4f of the supports 4b that face outwards here overlap an edge of the wall section 26b of the wall element 26 and in that way hold and secure the connection device 3 to the wall element 26. For mounting, the supports 4b can for example be plugged in and locked in the corresponding openings on the lower side of the housing 4.

In FIG. 7, the lower side of the connection device 3 is clearly to be recognized with the second opening section 20 and the second openings 20a for the plugging in of the testing device 2 (see FIG. 2). In addition, the ends of the second contact tabs 17a and 17b are to be seen.

The supports 4b consequently make possible a mounting of the connection device 3 both on a mounting rail 25 and on a wall section 26b of a wall element 26.

It is conceivable that the pressure springs 15, 16 and 17, 18 are provided at their contact points with contact sections made of a special contact material or else that they work together with the contact tabs 15a, 16a, 17a, 18a.

While in accordance with the provisions of the Patent Statutes the preferred forms and embodiments of the invention have been illustrated and described, it will be apparent to those skilled in the art that changes may be made without deviating from the invention described above.

What is claimed is:

1. A testing arrangement for testing the electrical circuits of a terminal block assembly (3) by means of a testing device (2), comprising:
   (a) a plurality of terminal blocks (300) each including a general rectangular body formed of electrically insulating synthetic plastic material, said terminal block body having a pair of vertical parallel spaced side walls, a pair of vertical parallel spaced end walls, and horizontal top and bottom walls, said terminal block body containing:
      (1) a pair of horizontal bus bar sections (6, 8) arranged in collinear longitudinally-spaced mutually-insulated relation in a chamber contained in said terminal block body;
      (2) a pair of conductor clamping devices (5, 7) connected with the remote ends of said bus bar sections, respectively, said clamping devices being operable to connect the bare ends of insulated conductors with said bus bar sections, respectively, said terminal block body upper wall containing access openings (9, 10) arranged above said clamping devices, respectively;
      (3) an upper first pair of leaf spring electrical contacts (15b, 16b) having first ends connected with the upper surfaces of said bus bars, respectively, said first pair of leaf springs having upwardly directed second ends (15a, 16a) normally biased toward electrical engagement with each other, said terminal block body upper wall containing a first test opening (19a) arranged above said first contact second ends; and
      (4) a lower second pair of leaf spring electrical contacts (17b, 18b) having first ends connected with the lower surfaces of said bus bars, respectively, and downwardly directed second ends (17a, 18a) normally biased toward electrical engagement with each other, said terminal block body bottom wall containing a second test opening (20a) arranged below said second contact second ends; and
   (b) a testing arrangement (2) for testing the electrical condition of circuits associated with said terminal block assembly, said testing arrangement including for each terminal block;
      (1) a testing pin (24) formed of electrically insulating material, said testing pin having a free tip portion adapted for insertion into either one of said terminal block first and second test openings to electrically separate and electrically disengage the pair of spring contacts associated therewith; and
      (2) a dummy plug (21) formed of electrically insulating material, said dummy plug having a tip portion adapted for insertion into the other one of said first and second test openings to separate and electrically disengage the pair of spring contacts associated therewith, whereby said terminal block may be tested from above or below.

2. A testing arrangement as defined in claim 1, wherein said first and second pairs of contacts and said first and second test openings are centrally arranged opposite each other on said terminal block.

3. A testing arrangement as defined in claim 2, and further including an electrically insulating member (22) arranged between the adjacent ends of said bus bar sections.

4. A testing arrangement as defined in claim 3, and further including a plurality of compression springs (15 and 16; 17 and 18) biasing together the free ends of the leaf springs of each pair.

5. A testing arrangement as defined in claim 4, wherein said upper and lower pairs of leaf spring contacts are electrically connected in parallel.

6. A testing arrangement as defined in claim 2, wherein a plurality of said terminal blocks (300) are connected in side-by-side relation to define a terminal block assembly (3).

7. A testing arrangement as defined in claim 6, and further including a plurality of laterally-spaced mounting feet (4b) arranged adjacent opposite ends of the lower portion of said terminal block assembly, respectively, said mounting feet being operable to connect said assembly alternately to a mounting rail (25) or to the opposite edges (26b) of a wall opening (26a).

8. A testing arrangement as defined in claim 6, and further including at least one protective cover member (27) arranged on said terminal block assembly for displacement between covered and uncovered positions relative to at least one of said access openings.

9. A testing arrangement as defined in claim 8, wherein said protective cover member comprises a protective cover plate (27) extending longitudinally of said assembly over corresponding terminal block access openings, said assembly including a guide arrangement (4c) mounting said protective plate for longitudinal sliding displacement between a closed position covering the associated access openings, and an open position in which openings (27d) arranged in said protective cover plate are positioned over said access openings, respectively.

10. A testing arrangement as defined in claim 9, wherein a pair of said protective cover plates are mounted above the rows of access openings adjacent opposite sides of said terminal block assembly, respectively.

11. A testing arrangement as defined in claim 9, and further including a conductive bridging device (70) arranged below said protective cover plate, said bridging device extending between corresponding access openings contained in selected ones of said terminal blocks for engagement with the associated clamping devices, thereby to connect together electrically said selected terminal blocks.

* * * * *